United States Patent [19]
Drouot

[11] Patent Number: 5,636,115
[45] Date of Patent: Jun. 3, 1997

[54] VOLTAGE BOOSTER CIRCUIT

[75] Inventor: Sylvie Drouot, Luynes, France

[73] Assignee: SGS-Thomson Microelectronics S.A., Saint Genis, France

[21] Appl. No.: 423,396

[22] Filed: Apr. 19, 1995

[30] Foreign Application Priority Data

Apr. 21, 1994 [FR] France .................. 94 04985

[51] Int. Cl.$^6$ .................................. H02M 3/18
[52] U.S. Cl. .................. 363/60; 327/536; 307/110
[58] Field of Search .................. 363/60; 307/110; 327/536

[56] References Cited

U.S. PATENT DOCUMENTS

| | | | |
|---|---|---|---|
| 4,621,315 | 11/1986 | Vaughn et al. | 363/60 |
| 4,794,278 | 12/1988 | Vajdic | 307/297 |
| 5,003,197 | 3/1991 | Nojima et al. | 307/296.2 |
| 5,038,325 | 8/1991 | Douglas et al. | 365/189.06 |
| 5,367,489 | 11/1994 | Park et al. | 365/189.11 |

FOREIGN PATENT DOCUMENTS 2261307  5/1993  United Kingdom .......... G11C 11/407

OTHER PUBLICATIONS

IEEE Journal of Solid State Circuits, vol. 26, No. 4, Apr. 1991, pp. 465–472, Nakakome, et al., "An Experimental 1.5-V 64Mbit DRAM".

IEEE Journal of Solid-State Circuits, vol. 18, No. 5, Oct. 1983, New York, US pp. 452–456, Nakano et al., "A Sub–100NS 256K Dram With Open Bit Line Scheme".

IEEE International Solid State Circuits Conference, vol. 34, Feb. 1991, New York, US, pp. 268–269 Sato et al., "A 4MB Pseudo SRAM Operating At 2.6 +/–1V With 3MUAMPERE Data Retention Current".

*Primary Examiner*—Peter S. Wong
*Assistant Examiner*—Shawn Riley
*Attorney, Agent, or Firm*—Wolf, Greenfield & Sacks, P.C.; James H. Morris

[57] ABSTRACT

A voltage booster circuit using at least one capacitor. This capacitor receives a clock signal at one terminal, and a second terminal of the capacitor is connected, firstly, to a supply terminal by means of a precharging transistor and, secondly, to an output by means of an insulation transistor. The disclosed device includes control circuits for controlling the transistors such that they are not on at the same time and such that the voltages that control them are greater than the highest potential present at their source or at their drain.

44 Claims, 4 Drawing Sheets

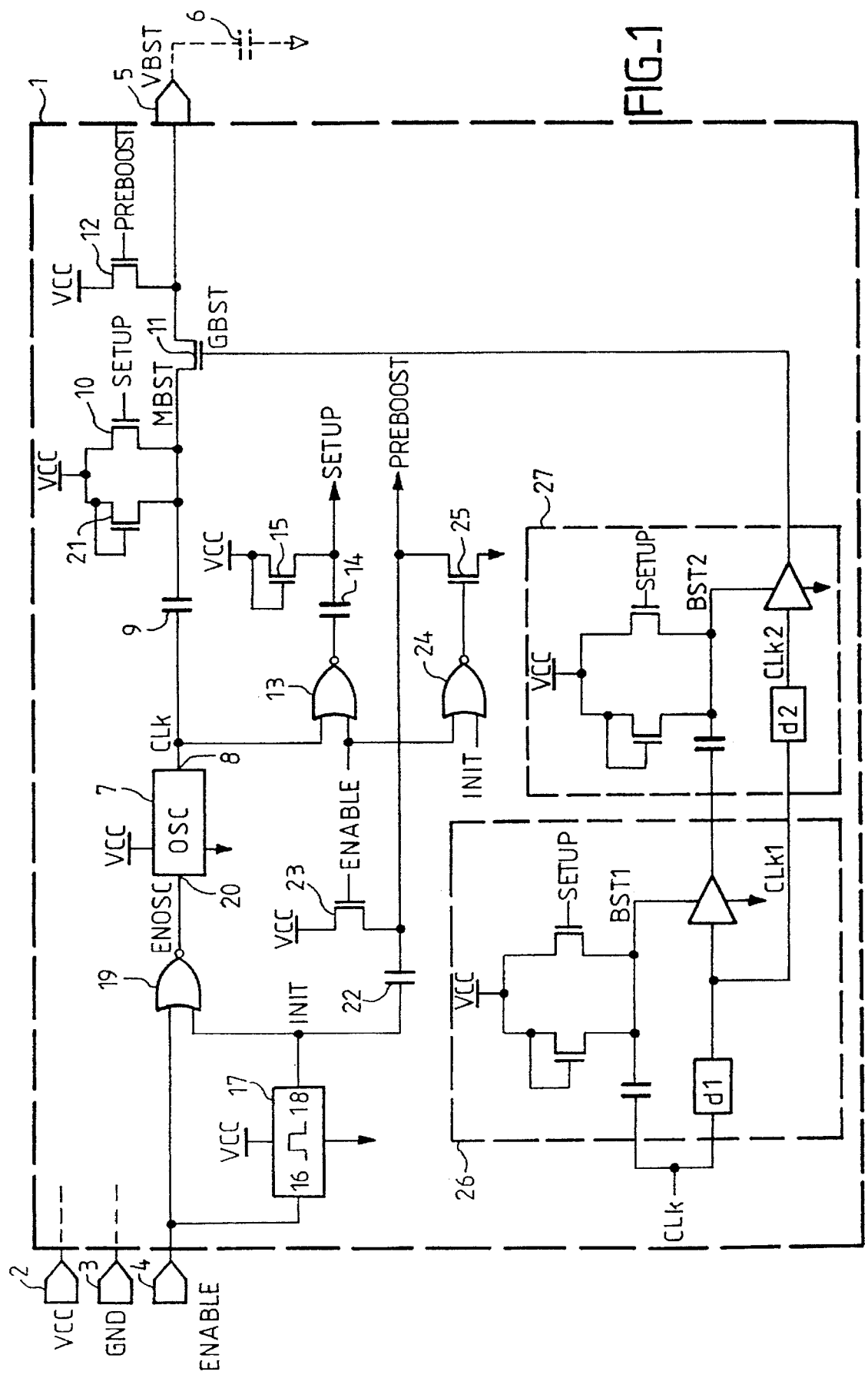
FIG_1

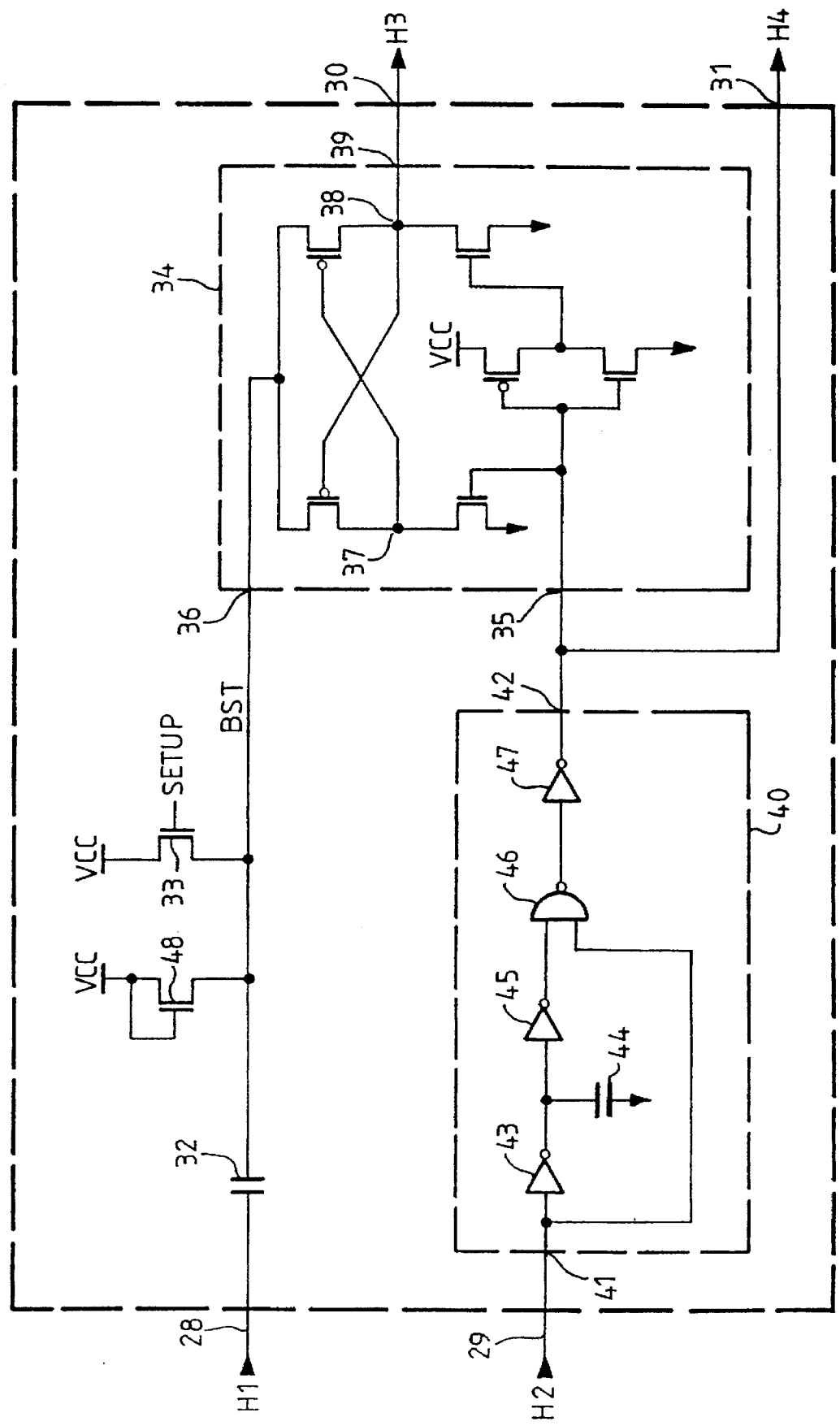
FIG_2

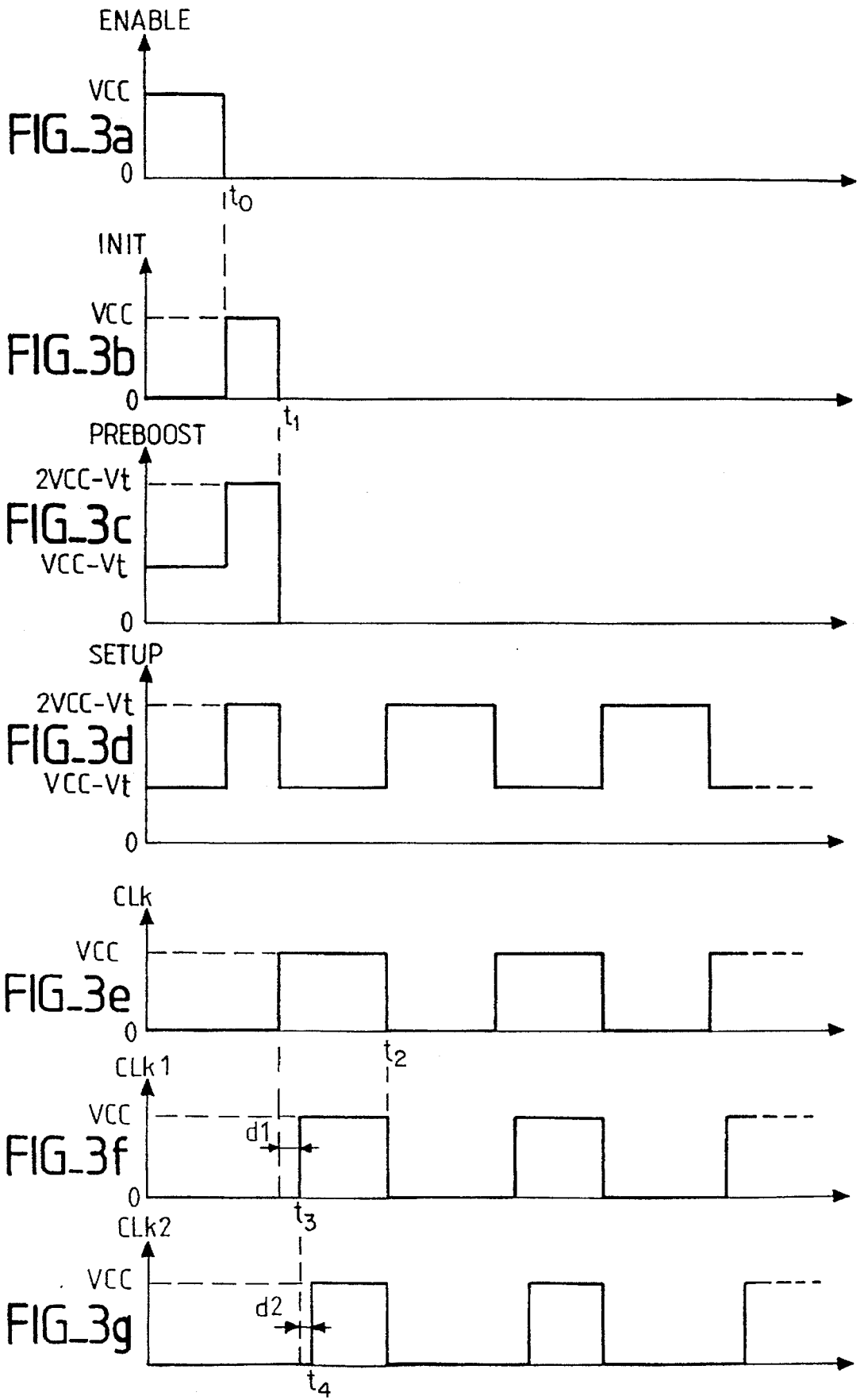

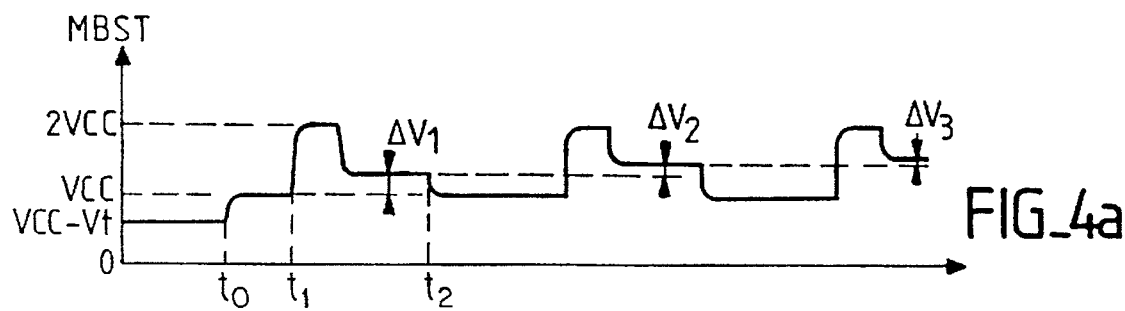
FIG_4a
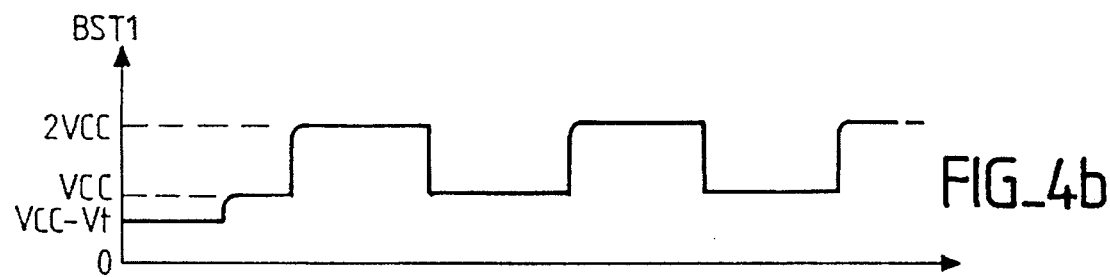
FIG_4b
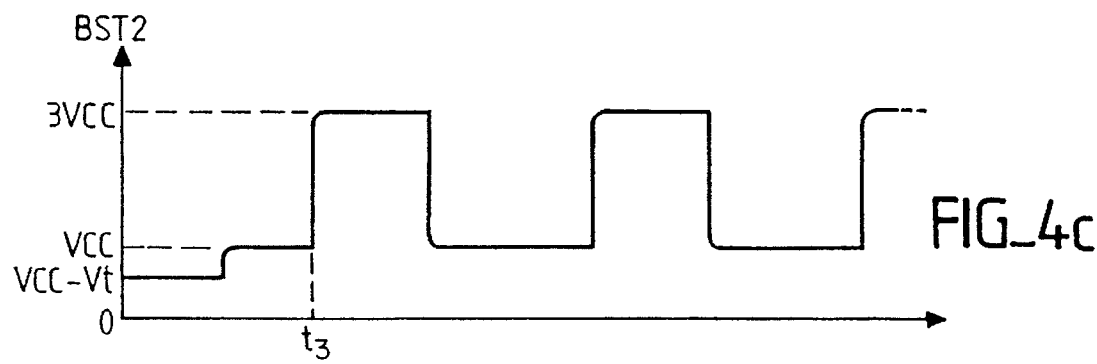
FIG_4c
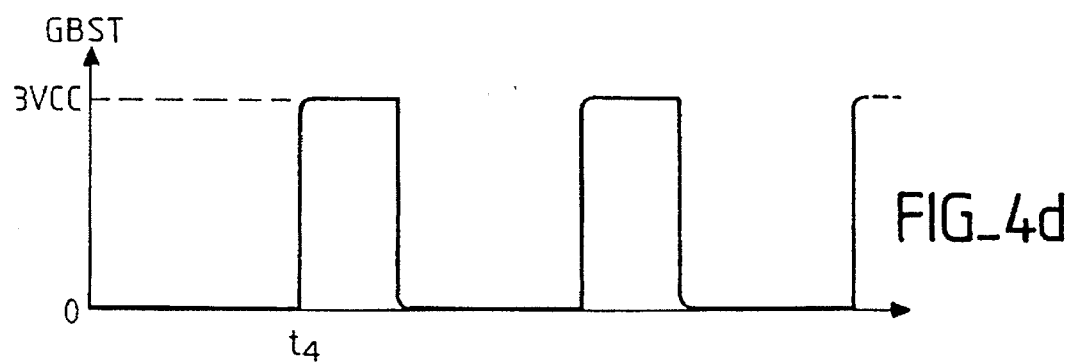
FIG_4d
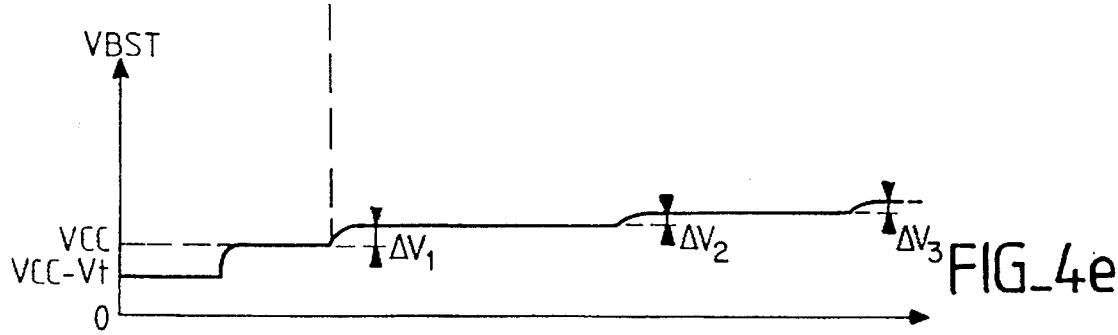
FIG_4e 15,636,115

VOLTAGE BOOSTER CIRCUIT

BACKGROUND OF THE INVENTION

1. Field of the Invention

The invention relates to a voltage multiplier or booster circuit working at low supply voltages. A circuit such as this is used to produce an output voltage from a received supply voltage by the charging and discharging of one or more capacitors consecutively so that the output voltage is greater than the supply voltage. This circuit, which is called a load pump, finds application chiefly in the supplying of capacitive circuits.

2. Discussion of the Related Art

Voltage boosters are used for example in the field of non-volatile memories organized in matrix form in rows and columns, and comprising storage cells made of MOS-type transistors placed at the intersections of the rows and the columns. Voltage boosters are used to produce bias voltages applied to the control gates of these transistors. Indeed, a model may be made of all the control gates of these transistors by means of an equivalent capacitance, these control gates being voltage-controlled and not current-controlled. For a read-only memory comprising several thousands of rows and columns, an equivalent capacitance value of one or more hundreds of picofarads is commonly reached.

In the prior art, there are known voltage booster circuits called Schenkel circuits. This type of circuit has one or more series-connected stages. Each stage has one input and one capacitor, a first terminal of which is connected to the input. This terminal receives a clock signal. The other terminal of this capacitor is connected to an output by means of an insulation diode.

Typically, the clock signal oscillates between a reference potential received at a first input terminal and a supply potential received at a second input terminal (in practice, a ground and a positive voltage VCC of the order of 5 volts for example).

The capacitor of the first stage has its second terminal connected to the second input terminal by means of another diode. Thus, when the clock of the first stage is at the ground potential, the capacitor is charged at the potential of this input terminal, minus losses due to the threshold effect and the substrate effect in the diode (made in practice with a MOS transistor whose control gate is connected to the source). Then, when the clock signal is at the potential VCC, the voltage at the terminals of the capacitor rises to 2 * VCC–Vt, and this capacitor then charges the capacitor of the next stage for which it has been ensured that the clock signal is placed at the ground potential. When the potential of the clock signal goes to the potential VCC, the voltage at the terminals of the capacitor of the second stage then rises to 3 * VCC–2 Vt (transfer diode) etc. Thus, at each stage, the voltage at the terminals of the capacitor increases by VCC–Vt multiplied by one. The last stage gives the output voltage at its output. This output is a capacitive node and a model may be made of the circuit to be supplied by means of a capacitor connected between this output and the ground. By charge transfer, the output potential will gradually rise by ever smaller stages until it reaches the potential (n+1)* (VCC–Vt), with n as an integer, taking n series-connected stages. The speed of this increase will greater or smaller depending on the capacitance values of the capacitor and on the transfer gain resulting therefrom.

This type of circuit has two drawbacks:

firstly, because of the losses due to the insulation diodes mounted between the stages, the value of the output voltage is limited to (n+1)* [VCC–Vt]. Since, in order to restrict power consumption by the integrated circuits, it is desired to develop circuits supplied with lower supply voltages (for example 3 volts), this limitation of the output voltage is a detrimental factor. Indeed, the threshold voltage of a diode is typically equal to 1.2 to 1.5 volts, which is a limitation equivalent to half of the value of the supply voltage at worst, between one stage and the next stage;

secondly, these losses limit the number of charges transferred between each stage, causing an increase in the build-up time of the output voltage.

For example, if is desired to double the supply voltage and thus go from 3 volts to 6 volts, theoretically only one stage is enough. In practice, the output voltage is then limited between 4.5 and 5 volts. It is therefore necessary to add on at least one additional stage, which entails penalties in terms of the amount of space occupied. It is furthermore necessary to take account of the additional space requirement due to the presence of control circuits to produce the clock signal of the additional stages and to coordinate the clock signals with one another.

It is also possible to make the diodes using so-called native transistors, namely non-implanted transistors. These transistors have a low threshold voltage of the order of 0.2 to 0.4 volts. These approach would make it necessary, however, to qualify this type of technology, which is a particularly long and costly process.

SUMMARY OF THE INVENTION

In view of the above, the aim of the present invention is to propose a voltage booster circuit that resolves the drawbacks due to the presence of insulation diodes (these drawbacks being the drop in voltage, the increase in build-up time and even an additional space requirement dictated by the need to increase the number of stages in order to overcome these drawbacks).

According to the invention, this aim is achieved by a voltage booster circuit comprising a first input terminal to receive an input supply voltage, an output terminal to provide a boosted output supply voltage, an oscillator providing a clock signal at an output, a first capacitor having a first terminal connected to the output of the oscillator. The voltage booster also includes a first precharging transistor series-connected between the second terminal of the capacitor and the first input terminal to connect them when a precharging binary signal is active, and an insulation transistor series-connected between the second terminal of the capacitor and the output terminal to connect them when a discharging binary signal is active.

With this arrangement the diodes used in the prior art are replaced with transistors. By using, for example, N type MOS field-effect transistors, the voltage drops due to the presence of the diodes are eliminated. Further, by using transistors with binary control signals at a potential greater than the potential to be transferred (potential of the supply voltage in order to precharge a stage, potential of the output of the previous stage in order to transfer charges from one stage to the other) the capacitor is charged at the supply potential by means of the precharging transistor when the clock signal is in the low or inactive state (in practice at the potential of a ground). Similarly, the output terminal will be precharged in an equivalent way. Then, when the clock signal is at the supply potential (active state), the insulation transistor is turned on, the output potential being increased by charge transfer, it being understood that the output terminal is a capacitive node. The precharging of the output terminal is particularly useful because it makes it possible to reduce the build-up time of the output potential.

BRIEF DESCRIPTION OF THE DRAWINGS

The invention will be understood more clearly and other features and advantages shall appear from the following detailed description of an exemplary preferred embodiment. This description is given purely by way of an indication and in no way restricts the scope of the invention, and it is illustrated by the following figures:

FIG. 1 shows a voltage booster circuit made according to the invention;

FIG. 2 shows a discharging circuit used to produce the discharging signal;

FIGS. 3a to 3g are timing diagrams of control signals received or produced by the circuit to implement the invention;

FIGS. 4a to 4e are timing diagrams of analog signals produced by the voltage booster circuit.

DETAILED DESCRIPTION

FIG. 1 shows a voltage booster circuit 1, according to an embodiment of the present invention.

This voltage booster circuit 1 has a first input terminal 2 to receive an input supply voltage (VCC), a second input terminal 3 to receive a reference voltage (GND), a third input terminal 4 to receive an initialization signal (ENABLE), and an output terminal 5 to give a boosted supply voltage (VBST).

In practice, the second input terminal 3 is a ground (0 potential in the timing diagrams of FIGS. 3 and 4). In one example, VCC is equal for example to 3 volts.

The output terminal 5 is a capacitive node and supplies a circuit represented symbolically by an output capacitor 6 connected between this output terminal 5 and the reference terminal 3 (represented by a ground symbol).

The circuit 1 also has an oscillator 7 giving a clock signal CLK at an output 8. This clock signal CLK, shown in FIG. 3e, oscillates between the ground potential 0 (inactive state) and the supply potential VCC (the so-called active state).

This oscillator 7 gives the clock signal CLK when a binary control signal ENOSC for enabling the oscillator is in the logic state 1 (the so-called active signal), the signal given at the output 8 being at the potential 0 if this control signal ENOSC is in the logic state 0 (so-called inactive signal).

The output 8 of the oscillator 7 is connected to a terminal of a first capacitor 9. The second terminal of this capacitor 9 is connected to the drain of a precharging transistor 10 whose source is connected to the supply terminal 2. The reference MBST is given to the potential of this second terminal of the capacitor (illustrated in FIG. 4a).

In the exemplary embodiment described, it shall be assumed that the transistors are MOS (Metal-Oxide-Semiconductor) type field-effect transistors.

This precharging transistor 10 is used to carry the potential MBST to VCC when the clock signal CLK is inactive (potential 0).

The second terminal of the capacitor 9 is furthermore connected to the source of an insulation transistor 11 whose drain is connected to the output terminal 5.

This insulation transistor 11 is turned on when the clock signal CLK is active in order to transfer the charges from the capacitor 9 to the output terminal 5.

The drain of the insulation transistor 11 is connected to the supply terminal 2 by means of a precharging transistor 12.

FIG. 3a illustrates the initialization signal ENABLE. When this signal is at the logic level 1 (potential VCC), it is called inactive. The circuit 1 is then organized so that the potential VBST (illustrated in FIG. 4e) of the output terminal 5 is stable (regardless of the losses due to the circuits supplied by this output terminal 5). When the signal ENABLE goes to the logic level 0 (potential 0) it is said to be active and the output terminal 5 is then charged by means of the capacitor 9 through the insulation transistor 11.

In the example described, the precharging transistor 10 and insulation transistor 11 are N type field-effect transistors.

The control gate of the precharging transistor 10 receives a binary precharging signal SETUP illustrated in FIG. 3d. To produce this precharging signal SETUP, a two-input NOR gate 13 is used. This NOR gate 13 receives the clock signal CLK and the initialization signal ENABLE at its inputs. The output of this NOR gate is connected to a first terminal of a second capacitor 14. The second terminal of this capacitor 14 is connected to the supply terminal 2 by means of an N type field-effect transistor 15 mounted as a diode. It is the second terminal of the capacitor 14 that gives the precharging signal SETUP.

So long as the precharging signal SETUP is inactive, the output of the NOR gate is at the potential 1 (namely VCC) and signal SETUP is at the potential VCC−Vt, the reference Vt being applied to the threshold voltage of the transistor 15. It shall be said that this potential VCC−Vt corresponds to an inactive state of the precharging signal SETUP. The precharging transistor 10 is then off.

If the initialization signal ENABLE is activated at an instant t0, then the precharging signal SETUP is carried to the potential 2*VCC−Vt by the capacitor 14. The precharging transistor 10 therefore comes on and the second terminal of the capacitor 9 is taken to the potential VCC. Thus, the drawback of the Schenkel type circuits in which the precharging potential is limited to VCC−Vt is eliminated.

In order that the circuit may be used to carry the output voltage VBST to 2*VCC, it is of course necessary for the clock signal CLK to be inactive during the precharging of the capacitor 9.

To do this, the following procedure is used:

the input terminal is connected to the input 16 of a monostable circuit 17 so that, at the instant t0, this monostable circuit produces a positive pulse at an output 18. This output 18 of the monostable circuit 17 produces an output precharging initialization signal INIT illustrated in FIG. 3b. This signal INIT is binary and is either at the potential 0 (inactive state) or at the potential VCC (active state). At t0, the signal INIT goes to the active state and at a subsequent instant t1, it goes back to the inactive state;

the output 18 of the monostable circuit 17 is connected to an input of a two-input NOR gate 19. The other input of this NOR gate 19 receives the initialization signal ENABLE. The output of this gate 19 is connected to an input 20 of the oscillator 7 and gives it the control signal ENOSC. Thus, so long as the initialization signals ENABLE and INIT are at the potential VCC, the clock signal CLK is kept at potential 0.

At the instant t1, the oscillator 7 is put into operation and the clock signal CLK starts oscillating between VCC and 0, in phase opposition with the precharging signal SETUP. When the precharging signal SETUP is active, the potential MBST is taken to VCC and then to 2*VCC when the clock signal goes to the active state, the precharging transistor 10 being then off.

To reduce the build-up time of the potential MBST, it would be useful for the time interval t1–t0 to be as short as possible while at the same time being of a sufficient duration for this potential to reach the level of the potential VCC. To do this, the second terminal of the capacitor 9 is connected to the supply terminal 2 by means of an N type field-effect transistor 21 mounted as a diode. Thus, the potential MBST is equal to VCC–Vt (it is assumed that all the transistors have the same threshold voltage) when the initialization signal ENABLE is inactive. In practice, the time interval t1–t0 is determined by the choice of a value of resistance and a value of capacitance associated with the monostable circuit.

The output precharging initialization signal INIT is also used to precharge the output terminal 5 and to carry its potential VBST to VCC. To do this, there is produced an output precharging control signal PREBOOST applied to the control gate of the precharging transistor 12 in such a way that its transistor 12 is on for as long as the signal INIT is active.

Just as in the case of the precharging signal SETUP, the output precharging signal PREBOOST (illustrated in FIG. 3c) will be taken to the potential 2*VCC–Vt between the instants t0 and t1. To do this, the output 18 of the monostable circuit 17 is connected to a first terminal of a capacitor 22. The other terminal of this capacitor 22 is connected to the supply terminal 2 by means of an N type field-effect transistor 23 whose control gate receives the initialization signal ENABLE. The output precharging signal PREBOOST is the signal present at the second terminal of this transistor 23.

So long as the initialization signal ENABLE is inactive, the signal PREBOOST is at the potential VCC–Vt. At the instant t0, the signal INIT goes to the potential VCC and the potential of the signal PREBOOST is therefore taken to 2*VCC–Vt.

At the instant t1, the precharging transistor 12 is off, and this insulates the output terminal 5 from the supply terminal 2 and permits the build-up of the potential VBST to 2*VCC. Provision could then be made for bringing the signal PREBOOST down to the potential 0. For this purpose, it is enough to connect the second terminal of the capacitor 22 to the ground by means of an N type field-effect transistor 25. The control gate of this transistor 25 is connected to the part of a two-input NOR gate 24 that receives the initialization signals ENABLE and INIT at its input. It will be noted that, by means of the transistor 23 (which is equivalent to a diode when ENABLE is inactive), the build-up time to VCC of the potential VBST is reduced in the same way as the build-up time the potential MBST to VCC is reduced (by means of the transistor Having described the precharging of the capacitor 9 and of the output terminal 5 (or of the capacitor 6, which amounts to the same thing), we shall now describe the way in which the potential VBST is increased by charge transfer between the capacitor 9 and the output terminal 5.

To discharge the capacitor 9 at the output terminal 5, the insulation transistor 11 is turned on as soon as the potential MBST has been built up to 2*VCC. Once the discharging has been done, this transistor 11 is turned off and the capacitor 9 is charged again.

To turn the discharging transistor 11 on or off, a binary charging control signal GBST (illustrated in FIG. 4d) is applied to its control gate.

In order that the charge transfer may be done without loss, the charging signal GBST should be greater than 2*VCC when it is desired to turn the insulation transistor 11 on.

To do this, charge control circuits 26 and 27 will be used, implementing the same principle of operation as the precharging and charging circuits described here above, which use capacitors.

The principle consists in using a charge control circuit enabling the production of an output signal that can reach a potential greater than a signal received at input. Typically, therefore, there is produced a difference in potential of VCC between the input signal and the output signal.

The first charge control circuit 26 will receive the clock signal CLK at input and will produce a clock signal at output between 0 and 2*VCC. The latter clock signal is given to a charge control circuit 27, that is series-connected with the first circuit and will produce the signal GBST which could rise to 3*VCC.

A charge control circuit is described in FIG. 2.

It comprises:

a first input 28 to receive a first input clock signal H1, a second input 29 to receive a second input clock signal H2, a first output 30 to give a first output clock signal H3, and a second output 31 to give a second output clock signal H4.

In practice, the first and second input clock signals may take two values: either the reference potential 0 (inactive state) or a potential that is a multiple of VCC (active state).

Let it be assumed for example that the input clock signal H1 is between 0 and m *VCC with m as an integer.

The input 28 is connected to the first terminal of a capacitor 32. The second terminal of this capacitor 32 is connected to the supply terminal 2 by means of an N type field-effect precharging transistor 33 receiving the precharging signal SETUP at its control gate.

The reference BST is applied to the potential of the second terminal of the capacitor 32. BST is an pumped internal supply voltage ("internal" to make a distinction with VBST that is provided in the output). By seeing to it that the first input clock signal H1 is inactive during the time interval when the precharging signal SETUP is active, it is possible to precharge the capacitor at BST=VCC. Then, when the signal H1 is active, the capacitor will be charged and BST will rise to (m+1) *VCC.

Furthermore, a switch 34 will be used to produce the first output clock signal so that this signal oscillates between 0 and (m+1) *VCC.

To do this, this switch 34 receives the second output clock signal H4 at an input 35, it being possible for this signal to be at the potential 0 or at the potential VCC.

This clock signal H4 is applied to the input of an inverter formed by two transistors, which are respectively P and N type transistors series-connected between the supply terminal 2 and the reference terminal 3. At its output, therefore, this inverter delivers a signal oscillating between 0 and VCC, in phase opposition with the second output clock signal H4.

The switch 34 furthermore has two arms formed by two transistors which are respectively P and N type transistors series-connected between an input 36 and the reference terminal 3. The input 36 is connected to the second terminal of the capacitor 32 and is therefore at the potential BST.

The N type transistor of the first arm 37 has its control gate connected to the input of the inverter while the N type transistor of the second arm 38 has its control gate connected to the output of the inverter.

The P type transistor of the first arm 37 has its control gate connected to the midpoint of the transistors of the second arm 38. The P type transistor of the second arm 38 has its control gate connected to the midpoint of the transistors of the first arm 37.

The switch 34 finally has an output 39 connected to the midpoint of the transistors of the second arm, this output 39 being connected to the output 30 of the switch 34.

In receiving a second output clock signal H4 which is inactive (potential 0) when the first input clock signal H1 is inactive (potential 0), the switch 34 will therefore produce an output signal (first output clock signal H3 of the charge control circuit) which is at the potential 0. When the first input clock signal H1 is active, if the second output clock signal H4 goes to the active state, the first output clock signal H3 will rise to the potential of (m+1) *VCC, It is possible to use clock signals H1 and H4 that are identical. In practice, it will be preferred to delay the passage, to the active state, of the second output clock signal H4 in order to allow the capacitor the time to take the potential VBST to (m+1) *VCC, which is not immediate.

To do this, the second output clock signal H4 is produced from the first input clock signal H2 in the manner described here below.

The input 29, which receives H2, is connected to an input 41 of a delay circuit 40, this circuit giving the second output clock signal H4 to an output 42. The input 41 of the delay circuit 40 is connected to an inverter 43 whose output is connected to a terminal of a capacitor 44 whose other terminal is connected to the reference terminal 3.

The output of the inverter 43 is furthermore connected to the input of an inverter 45. The output of this inverter 45 is connected to an input of a two-input NAND gate 46. The other input of this NAND gate 46 is connected to the input 41 of the delay circuit 40, and its output is connected to the output 42 of this circuit 40 by means of an inverter 47.

Thus, when the input clock signal H2 goes from the inactive state to the active state, the output clock signal H4 remains in the inactive state for a certain period of time due to the gradual discharging of the capacitor It will be noted that, when the input clock signal H2 flips over into the other state, the second output clock signal H2 goes simultaneously to the inactive state by means of the NAND gate 46.

If the input clock signals H1 and H2 are synchronous and simultaneously in the same state (active or inactive), the output clock signals H3 and H4 will themselves be synchronous and simultaneously in the same state.

The cyclical ratio of the output clock signals will have been simply modified with respect to that of the input clock signals so as to delay the passage of the former to the active state.

Since it has been stated that the second output clock signal H4 oscillates between 0 and VCC, the same is clearly also true for the second input clock signal H2 and the logic circuits of the delay circuit 40 are supplied between the supply terminal 2 and the reference terminal 3.

It will be noted that it is possible to connect the second terminal of the capacitor 32 to the supply terminal 2 by means of an N type field-effect transistor 48 mounted as a diode. This makes it possible not to bring potential BST to below VCC−Vt in order to reduce the precharging time of this capacitor 32.

In the circuit 1 made according to the invention, two series-connected charge control circuits 26 and 27 are used.

The first circuit 26 receives the clock signal CLK at its two inputs. The first output of this circuit 26 is connected to the first input of the second charge control circuit 27. The second circuit 27 has its second input connected to the second output of the first circuit 26 and its output connected to the control gate of the insulation transistor 11.

FIG. 3f illustrates the temporal evolution of the second output clock signal, referenced CLK1, of the first charge control circuit 26.

FIG. 3g illustrates the temporal evolution of the second output clock signal, referenced CLK2, of the second charge control circuit 27.

FIG. 4b illustrates the temporal evolution of the potential, referenced BST1, of the second terminal of the capacitor of the first charge control circuit 26.

FIG. 4c illustrates the temporal evolution of the potential, referenced BST2, of the second terminal of the capacitor of the second charge control circuit 27.

Up to the instant t0, the potentials BST1 and BST2 are at VCC−Vt. At the instant t0, the precharging signal SETUP is activated and these potentials are taken to VCC.

At the instant t1, the clock signal CLK is activated. At a subsequent instant t3, the clock signal CLK1 is activated with a delay d1=t3−t1 with respect to the clock signal CLK. At this instant t3, the potential BST1 has therefore risen to 2*VCC. At an instant t4, after the instant t3, the clock signal CLK2 is activated with a delay d2=t4−t3 with respect to the clock signal CLK2. At this instant t4, the potential BST2 has therefore risen to 3*VCC.

When the clock signal CLK goes back to the inactive state (instant t2), the clock signals CLK1 and CLK2 are inactivated simultaneously.

The charge control signal GBST, which is initially at the potential 0, has thus risen to 3*VCC at the instant t4 and remains at this potential up to the instant t2. Naturally, the instant t2 should be subsequent to the instant t4, otherwise the charge control signal would be constantly at the potential 0 and the charging transistor 11 would be constantly off, which would be meaningless.

In one example, a clock signal CLK having a cyclical ratio 1/2 and a period of 100 nanoseconds is considered. Naturally, the determining of these delays will take account of the capacitance values of the capacitors used. The values could be limited to some picofarads for the capacitors of the charge control circuits 26 and 27, given that these capacitors are used to produce a voltage-controlled signal (for the biasing of the transistor 11) and do not have the aim of giving a substantial level of current. It will be enough to produce delays d1 and d2 of some nanoseconds. However, it will be necessary to take account of the charge transfer between the series-connected charge control circuits.

With respect to the output supply voltage VBST, initially taken to the potential VCC at the instant t0, it will increase and go from VCC to VCC+DV1 (DV1>0) at the instant t4, the insulation transistor then coming on.

Indeed, the potential MBST is then at 2*VCC and the capacitor 9 will then get discharged at the output terminal to charge the equivalent capacitor 6. MBST will therefore come down to VCC+DV1.

It will be noted that, preferably, the delays d1 and d2 should be determined in such a way that the capacitor 9 has had the time to be charged at 2*VCC; if not, the build-up time of the output voltage VBST will be reduced.

By repeating the process, the output voltage VBST will gradually be increased by a value DVn at each nth clock cycle so as to tend asymptomatically towards 2*VCC. The DVn values will gradually diminish in amplitude. Depending on the value to be attained within a given period of time, it is possible, the approximate value of the capacitance of the equivalent capacitor being known, to determine accordingly the value of the capacitance of the capacitor 9 and the necessary number of clock cycles.

To the extent possible, it will be sought to use a capacitor 9 having substantial capacitance to reduce the time needed to bring the output voltage to the desired value. In practice, the operation is limited by the size of the circuit and it is difficult to equalize the capacitance values of the capacitors 9 and 6, the latter typically reaching a value of some hundreds of picofarads.

It will be noted that the precharging signal SETUP considered is one that is in phase opposition with the clock signal CLK, which is not obligatory. The precharging signal SETUP used could have been one that is active during a shorter period of time, provided that it is not active when the clock signal CLK is active, in which case the capacitors would get discharged into the supply terminal 2.

It would also be possible to use charge control circuits 26 and 27 without an inverter between their output and the output of their NAND gate, it being understood that the number of these circuits is an even number. This makes it possible to reduce the general space requirement of the circuit. Besides it is to reduce this space requirement that the transistors used will be preferably N type transistors rather than P type transistors.

From a more general point of view, the approaches proposed by the invention can easily be applied to multi-stage Schenkel type pumps. Similarly, it is possible to envisage the making of a voltage booster circuit comprising several series-connected capacitors in a manner similar to the principle implemented in the charge control circuits. A circuit such as this would nevertheless have the drawback of increasing the build-up time of the output voltage produced, with the total gain of the circuit and hence the total number of charges transferred being reduced as and when the stages are added.

Having thus described at least one illustrative embodiment of the invention, various alterations, modifications, and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A voltage booster circuit comprising:
a first input terminal to receive an input supply voltage;
an output terminal that provides a boosted output supply voltage greater than the input supply voltage;
an oscillator providing a clock signal at an output;
a first capacitor having a first terminal coupled to the output of the oscillator, and a second terminal;
a first precharging transistor series-connected between the second terminal of the first capacitor and the first input terminal, a control gate of the first precharging transistor being coupled to a precharging signal so that the second terminal of the first capacitor is coupled to the first input terminal when the precharging signal is active; and
an insulation transistor series-connected between the second terminal of the first capacitor and the output terminal to couple the second terminal of the first capacitor to the output terminal when a discharging signal is active;
the discharging signal not being produced as a function of the boosted output supply voltage; and
wherein the discharging signal, when it is active, is at a potential greater than a sum of a potential of the first input terminal and a highest potential of the clock signal.

2. The circuit according to claim 1, further comprising precharging control means to produce the precharging signal in such a way that the precharging signal is active when the clock signal is inactive and the precharging signal is inactive when the clock signal is active.

3. A voltage booster circuit comprising:
a first input terminal to receive an input supply voltage;
an output terminal that provides a boosted output supply voltage greater than the input supply voltage;
an oscillator providing a clock signal at an output;
a first capacitor having a first terminal coupled to the output of the oscillator, and a second terminal;
a first precharging transistor series-connected between the second terminal of the first capacitor and the first input terminal, a control gate of the first precharging transistor being coupled to a precharging signal so that the second terminal of the first capacitor is coupled to the first input terminal when the precharging signal is active;
an insulation transistor series-connected between the second terminal of the first capacitor and the output terminal to couple the second terminal of the first capacitor to the output terminal when a discharging signal is active;
precharging control means to produce the precharging signal in such a way that the precharging signal is active when the clock signal is inactive and the precharging signal is inactive when the clock signal is active;
a second input terminal to receive a binary initialization signal; and
the precharging control means includes a two-input NOR gate and a second capacitor, the NOR gate receiving the clock signal at a first input and the binary initialization signal at a second input, wherein an output of the NOR gate is coupled to a first terminal of the second capacitor, and wherein a second terminal of the second capacitor is coupled to a first terminal of an active element having a second terminal coupled to the first input terminal, the second terminal of the second capacitor also being coupled to the control gate of the first precharging transistor.

4. The circuit according to claim 1, further comprising discharge control means to produce the discharging signal in such a way that the discharging signal is active when the clock signal is active and is inactive when the clock signal is inactive.

5. A voltage booster circuit comprising:
a first input terminal to receive an input supply voltage;
an output terminal that provides a boosted output supply voltage greater than the input supply voltage;
an oscillator providing a clock signal at an output;
a first capacitor having a first terminal coupled to the output of the oscillator, and a second terminal;
a first precharging transistor series-connected between the second terminal of the first capacitor and the first input terminal, a control gate of the first precharging transistor being coupled to a precharging signal so that the second terminal of the first capacitor is coupled to the first input terminal when the precharging signal is active;

an insulation transistor series-connected between the second terminal of the first capacitor and the output terminal to couple the second terminal of the first capacitor to the output terminal when a discharging signal is active; and discharge control means to produce the discharging signal in such a way that the discharging signal is active when the clock signal is active and is inactive when the clock signal is inactive;

wherein the discharging control means includes a discharging circuit, the discharging circuit including:
a first input to receive a first input clock signal;
a second input to receive a second input clock signal;
a first output to provide a first output clock signal;
a second output to provide a second output clock signal; and wherein
from the first input clock signal, the discharging circuit produces a pumped internal supply voltage;
the second output clock signal is inactive when the second input clock signal is inactive and it passes to an active state with a certain delay after the second input clock signal passes to an active state; and
the first output clock signal is at a potential of the pumped internal supply voltage when the second output clock signal is active, and at a reference potential provided by a third input terminal when the second output clock signal is inactive.

6. The circuit according to claim 5, wherein the discharging circuit further includes:
a third capacitor having a first terminal coupled to the first input of the discharging circuit and a second terminal coupled to the first input terminal with a second precharging transistor having a control gate coupled to the precharging signal; and
a switch having an input coupled to the second output clock signal and an output, coupled to the first output of the discharging circuit, that selectively couples the first output of the discharging circuit to either the second terminal of the third capacitor or to the third input terminal.

7. The circuit according to claim 5, wherein the discharging control means includes at least two discharging control circuits series-connected and wherein:
a first discharging circuit receives the clock signal at first and second inputs;
a first input of a second discharging circuit is coupled to a first output of the first discharging circuit;
a second input of the second discharging circuit is coupled to a second output of the first discharging circuit; and
a first output of the second discharging circuit is coupled to a control gate of the insulation transistor.

8. The circuit according to claim 3 further comprising an output precharging transistor to couple the output terminal to the first input terminal when an output precharging initialization signal is active.

9. The circuit according to claim 8, further comprising output precharging control means to produce the output precharging initialization signal such that:
the output precharging initialization signal goes from an inactive state to an active state when the binary initialization signal goes from an inactive state to an active state;
the output precharging initialization signal goes to the inactive state after a specified period of time after the initialization signal goes from the inactive state to the active state; and an oscillator control signal is inactive so long as the binary initialization signal is inactive or so long as the output precharging signal is active.

10. The circuit according to claim 9, wherein the output precharging control means includes a monostable circuit having an input coupled to the second input terminal and an output coupled to a first terminal of a fourth capacitor, a second terminal of the fourth capacitor being coupled to the first input terminal by means of a third precharging transistor, the third precharging transistor receiving the binary initialization signal at a control terminal, the second terminal of the fourth capacitor also being coupled to:
a third input terminal, coupled to ground, by means of a transistor having a control gate coupled to an output of a two-input NOR gate, the NOR gate receiving the binary initialization signal and the output precharging initialization signal at first and second inputs respectively; and
a control gate of the output precharging transistor.

11. The circuit according to claim 9, wherein the oscillator receives the oscillator control signal from a two-input NOR gate having inputs that receive the binary initialization signal and the output precharging initialization signal, the oscillator providing the clock signal when the oscillator control signal is active.

12. The circuit according to claim 1, wherein the first precharging transistor is an N type transistor.

13. The circuit according to claim 1, wherein the precharging signal, when it is active, is at a potential greater than a potential of the first input terminal.

14. The circuit according to claim 5, wherein the discharging signal, when it is active, is at a potential greater than a sum of a potential of the first input terminal and a highest potential of the clock signal.

15. The circuit according to claim 1, further comprising a diode-mounted transistor parallel-connected with the first precharging transistor.

16. The circuit according to claim 1 in combination with an electrically programmable memory such that the electrically programmable memory is coupled to the output terminal.

17. The circuit according to claim 11, wherein the first precharging transistor, the second precharging transistor, the output precharging transistor, and the third precharging transistor are N type transistors.

18. The circuit according to claim 17, wherein the precharging signal, when it is active, is at a potential greater than a potential of the first input terminal.

19. The circuit according to claim 18, wherein the discharging signal, when it is active, is at a potential greater than a sum of a potential of the first input signal and a highest potential of the clock signal.

20. The circuit according to claim 19, further comprising a plurality of diode-mounted transistors, each of the first precharging transistor and the second precharging transistor, being parallel-connected with one of the plurality of diode-mounted transistors.

21. The circuit according to claim 20 in combination with an electrically programmable memory such that the electrically programmable memory is coupled to the output terminal.

22. The circuit according to claim 1, further comprising a precharging controller which provides the precharging signal in such a way that the precharging signal is active when the clock signal is inactive and the precharging signal is inactive when the clock signal is active.

23. The circuit according to claim 1, further comprising a controller which provides the discharging signal in such a way that the discharging signal is active when the clock signal is active and is inactive when the clock signal is inactive.

24. The circuit according to claim 8, further comprising an output precharging controller which provides the output precharging initialization signal such that:

the output precharging initialization signal goes from an inactive state to an active state when the binary initialization signal goes from an inactive state to an active state;

the output precharging initialization signal goes to the active state after a specified period of time after the initialization signal goes from the inactive state to the active state; and an oscillator control signal is inactive so long as the binary initialization signal is inactive or so long as the output precharging signal is active.

25. A voltage booster circuit comprising:

an output that provides an output supply voltage that is greater than an input supply voltage;

an oscillator providing a clock signal at a clock output;

a first capacitor having a first terminal coupled to the output of the oscillator, and a second terminal;

precharging means, coupled between the second terminal of the first capacitor and the input supply voltage, for coupling the second terminal of the first capacitor to the input supply voltage when a precharging signal is in an active state; and insulating means, coupled between the second terminal of the first capacitor and an output terminal, for coupling the second terminal of the first capacitor to the output terminal when a discharging signal is in an active state, and for insulating the second terminal of the first capacitor from the output terminal when the discharging signal is in an inactive state;

the discharging signal not being produced as a function of the output supply voltage; and wherein the discharging signal, when it is active, is at a potential greater than a sum of a potential of the input supply voltage and a highest potential of the clock signal.

26. The voltage booster circuit of claim 25, further comprising output precharging means, coupled between the insulating means and the output terminal, for coupling the output terminal to the input supply voltage when an output precharging signal is active.

27. The voltage booster circuit of claim 26, wherein the circuit further comprises control means for providing the precharging signal, the discharging signal, and the output precharging signal.

28. The voltage booster circuit of claim 27, wherein the precharging signal is in the active state when the clock signal is in an inactive state, and the precharging signal is in an inactive state when the clock signal is in an active state.

29. The voltage booster circuit of claim 28, wherein the discharging signal is in the active state when the clock signal is in the active state, and the discharging signal is in an inactive state when the clock signal is in the inactive state.

30. The voltage booster circuit of claim 29, wherein the output precharging signal is in the active state when the initialization signal goes from an inactive state to an active state, the output precharging signal returning to an inactive state after a specified period of time.

31. A voltage booster circuit comprising:

an output that provides an output voltage that is greater than an input supply voltage;

an oscillator having a clock output that provides a clock signal;

a first capacitor having a first terminal coupled to the clock output of the oscillator, and having a second terminal;

a precharging circuit, coupled between the second terminal of the first capacitor and the input supply voltage, that couples the second terminal of the first capacitor to the input supply voltage when a precharging signal is in an active state; and an insulation circuit, coupled between the second terminal of the first capacitor and the output, that couples the second terminal to the output when a discharging signal is in an active state;

the discharging signal not being produced as a function of the output voltage; and wherein the discharging signal, when it is active, is at a potential greater than a sum of a potential of the input supply voltage and a highest potential of the clock signal.

32. The circuit according to claim 31, further comprising an output precharging circuit, coupled between the output and the input supply voltage, that couples the output to the input supply voltage when an output precharging initialization signal is in an active state.

33. The circuit of claim 31, further comprising a precharging control circuit that provides the precharging signal, the precharging signal being in an active state when the clock signal is in an inactive state and the precharging signal being in an inactive state when the clock signal is in an active state.

34. The circuit of claim 31, further comprising a discharging control circuit that provides the discharging signal, the discharging signal being in the active state when the clock signal is in the active state and the discharging signal being in an inactive state when the clock signal is in the inactive state.

35. The circuit of claim 31, further comprising an output precharging control circuit, coupled to the output precharging circuit, that provides the output precharging initialization signal, the output precharging initialization signal being in an active state when an initialization signal goes from an inactive state to an active state, the output precharging initialization signal returning to an inactive state after a specified period of time.

36. A method of boosting an input voltage to provide a boosted output voltage greater than the input voltage, the method including steps of:

preboosting an intermediate stage of a charge pump circuit to a voltage substantially equal to the input voltage when a clock signal is in an inactive state;

boosting the intermediate stage to a voltage substantially equal to at least twice the input voltage when the clock signal is in an active state; and discharging the voltage in the intermediate stage to an output when a discharging control signal is in an active state wherein a voltage of the discharging control signal, when it is in the active state, is at a voltage greater than the voltage in the intermediate stage, so that the boosted output voltage at the output has a value of at least twice the input voltage.

37. The method of claim 36, wherein the setup control signal is in the active state when the clock signal is in an inactive state and the discharging control signal is in the active state when the clock signal is in an active state.

38. The method of claim 37, further comprising the step of preboosting an output terminal to a voltage substantially equal to the input voltage when a preboosting control signal is in an active state.

39. The circuit according to claim 1, wherein the insulation transistor consists of one insulating transistor.

40. The circuit according to claim 1, further comprising first and second identical discharging circuits to provide the discharging signal.

41. The circuit according to claim 40, wherein each of the first and second discharging circuits includes:

a first input to receive a first input clock signal;

a second input to receive a second input clock signal;

a first output to provide a first output clock signal;

a second output to provide a second output clock signal; and wherein from the first input clock signal, the respective discharging circuit produces a pumped internal supply voltage;

the second output clock signal is inactive when the second input clock signal is inactive and the second output clock signal passes to an active state with a certain delay after the second input clock signal passes to an active state; and the first output clock signal is at a potential of the pumped internal supply voltage when the second output clock signal is active, and at a reference potential provided by a third input terminal when the second output clock signal is inactive.

42. The circuit according to claim 41, wherein each of the first and second discharging circuits further includes:

a third capacitor having a first terminal coupled to the first input of the respective discharging circuit and a second terminal coupled to the first input terminal with a second precharging transistor having a control gate coupled to the precharging signal; and a switch having an input coupled to the second output clock signal and an output, coupled to the first output of the respective discharging circuit, that selectively couples the first output of the respective discharging circuit to either the second terminal of the third capacitor or the third input terminal.

43. The circuit according to claim 41, wherein the first and second discharging circuits are series connected and wherein:

the first discharging circuit receives the clock signal at first and second inputs;

a first input of the second discharging circuit is coupled to a first output of the first discharging circuit;

a second input of the second discharging circuit is coupled to a second output of the first discharging circuit; and a first output of the second discharging circuit is coupled to a control gate of the insulation transistor.

44. The method of claim 36, wherein the discharging control signal is not provided as a function of the boosted output voltage.

* * * * *